(12) United States Patent
Kim et al.

(10) Patent No.: US 6,812,042 B2
(45) Date of Patent: Nov. 2, 2004

(54) CAPACITOR AND METHOD FOR FABRICATING FERROELECTRIC MEMORY DEVICE WITH THE SAME

(75) Inventors: Nam-Kyeong Kim, Ichon-shi (KR); Soon-Yong Kweon, Ichon-shi (KR); Seung-Jin Yeom, Ichon-shi (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/613,993

(22) Filed: Jul. 8, 2003

(65) Prior Publication Data
US 2004/0124453 A1 Jul. 1, 2004

(30) Foreign Application Priority Data
Dec. 27, 2002 (KR) .................. 10-2002-0085054

(51) Int. Cl.⁷ .............................................. H01L 21/00
(52) U.S. Cl. ........................................................ 438/3
(58) Field of Search ............................................ 438/3

(56) References Cited

U.S. PATENT DOCUMENTS 5,780,886 A * 7/1998 Yamanobe .................. 257/295
6,063,639 A   5/2000 Kim et al.
6,420,740 B1  7/2002 Zhang et al.
6,555,429 B2 * 4/2003 Matsui et al. ............... 438/241

* cited by examiner

Primary Examiner—David E. Graybill
(74) Attorney, Agent, or Firm—Jacobson Holman PLLC (57) ABSTRACT

The present invention provides a ferroelectric memory device capable of suppressing a defect generation due to a charge impact and a method for fabricating the same. The ferroelectric memory device includes: a semiconductor substrate on which a transistor is formed; a semiconductor substrate structure having a transistor; a lower electrode formed on an interfacial insulation layer and connected to a source/drain region of the transistor; an isolating insulation layer on the interfacial insulation layer; a ferroelectric layer covering the isolating insulation layer and lower electrode; an oxygen vacancy compensation layer being formed on the ferroelectric layer and compensating an oxygen vacancy caused by deoxidization of a composition of the ferroelectric layer; and an upper electrode formed on the oxygen vacancy compensation layer.

7 Claims, 9 Drawing Sheets

CAPACITOR AND METHOD FOR FABRICATING FERROELECTRIC MEMORY DEVICE WITH THE SAME

FIELD OF THE INVENTION

The present invention relates to a semiconductor device; and, more particularly, to a capacitor for use in a semiconductor device and a method for fabricating a having the same.

DESCRIPTION OF RELATED ARTS

With using a ferroelectric material for a capacitor used in a semiconductor memory device, a development of the device has been progressed in order to overcome a refresh limit of a prior dynamic random access memory (DRAM) device and use a large quantity of memory. A nonvolatile ferroelectric random access memory (FeRAM) is expected to be a promising memory device in near future due to some advantages of saving information even if a power is off and competing with the prior DRAM device in terms of an operation speed.

The nonvolatile memory device using the ferroelectric material inputs a signal by controlling a polarization direction controlled by applying an electric field, wherein a remnant polarization formed after the electric field is cut off is used for saving a digital signal 1 or 0.

Usually, $SrBi_2Ta_2O_9$ (SBT) or $Pb(Zr, Ti)O_3$ (PZT) film is used as a ferroelectric material for the FeRAM device. The ferroelectric material has a dielectric constant for a few hundreds to a few thousands at a room temperature and two types of stable remnant polarization status. Therefore, it is expected to apply a ferroelectric material film to the nonvolatile memory device.

In addition, a new ferroelectric material such as $Bi_{4-x}La_xTi_3O_{12}$ (BLT) and $Bi_4Ti_3O_{12}$ (BTO) have advantageous properties such as a superior reliability of the SBT and a low crystallization temperature of the PZT including a strong polarizability.

Figure 1A:
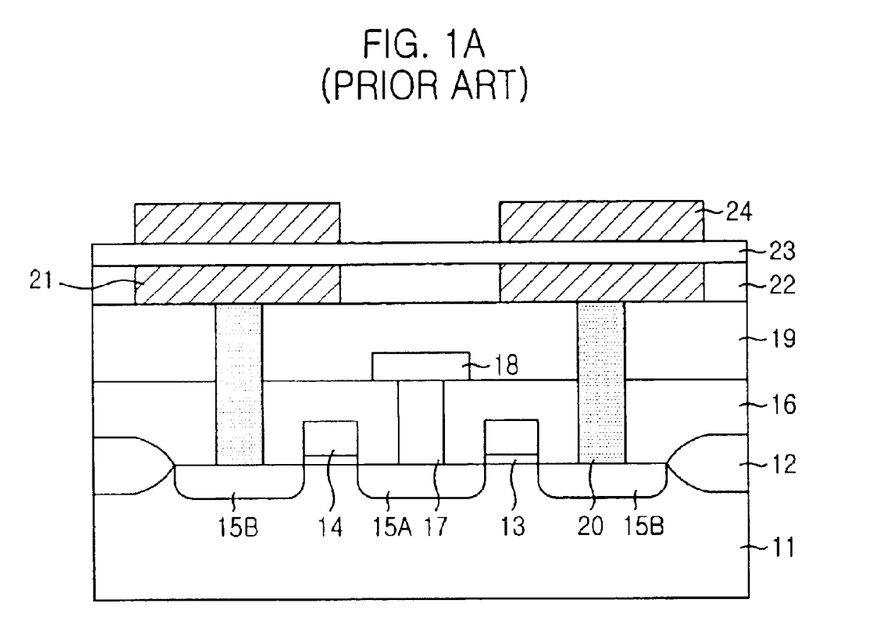
FIG. 1A is a cross-sectional view illustrating a conventional ferroelectric memory device.

FIG. 1A shows a cross sectional view illustrating a conventional ferroelectric memory device.

As shown, an isolation layer 12 predetermining an active region is formed on a semiconductor substrate 11. A stacked structure of a gate oxide layer 13 and a word line 14 is formed on the semiconductor substrate 11 thereafter. Source/drain regions 15A and 15B are formed on both right and left sides adjacent to the word line 14.

In addition, a first interfacial insulation layer 16 is formed on a transistor containing the word line 14 and the source/drain regions 15A and 15B. A bit line 18 is connected to one source/drain region 15A through a bit line contact 17 contacting to one source/drain region 15A by passing through the first interfacial insulation layer 16.

A second interfacial insulation layer 19 containing the bit line 18 is formed on an entire upper area of the transistor and a storage node contact 20 is formed thereon, wherein the first interfacial insulation layer 16 and the second interfacial insulation layer 19 are penetrated together in order to make the storage node contact 20 connected to the other source/drain region 15B.

A lower electrode 21 which should be connected to the storage node contact 20 is formed. Also, a planerized isolating insulation layer 22 for a separation of the lower electrode 21 from an adjacent electrode encompasses the lower electrode 21. Next, a ferroelectric layer 23 covers the insolating insulation layer 22 and the lower electrode 21, wherein the ferroelectric layer 21 uses the BTO or BLT and is formed only on a cell region.

An upper electrode 24 is formed on the formed ferroelectric layer 23. A capacitor structure shown in FIG. 1A is named as a merged top plate (MTP).

However, the BTO or BLT capacitor has a disadvantage that the BTO or BLT ferroelectric material is operated at a high speed in a high temperature ambiance, a data fatigue occurs generally and drastically, so that it causes a device data failure. Furthermore, the data fatigue brings about deoxidization of titanium (Ti) ions. More specifically, the Ti ion deoxidization is caused by a charge impact externally applied. In addition, the Ti ion deoxidization causes some defects, which are concentrated or diffused into an electrode interface, and consequently, those defects suppress a dipole formation. From this, the polarizability of the BTO or BLT is reduced. Eventually, the film impaired with such defects within its interface is prone to damage because a conductor phenomenon increases an applied electric field to the interface.

Figure 1B:
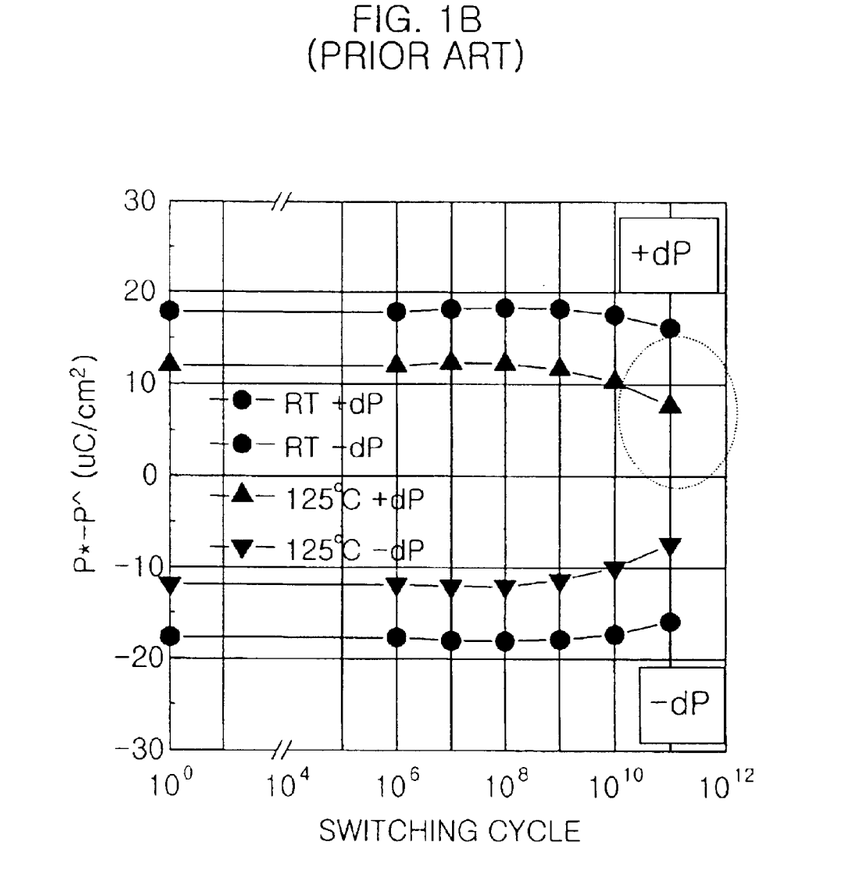
FIG. 1B is a graph showing reliability measurement result of a $Bi_{4-x}La_xTi_3O_{12}$ (BLT) layer fabricated by employing a conventional method.
Figure 1C:
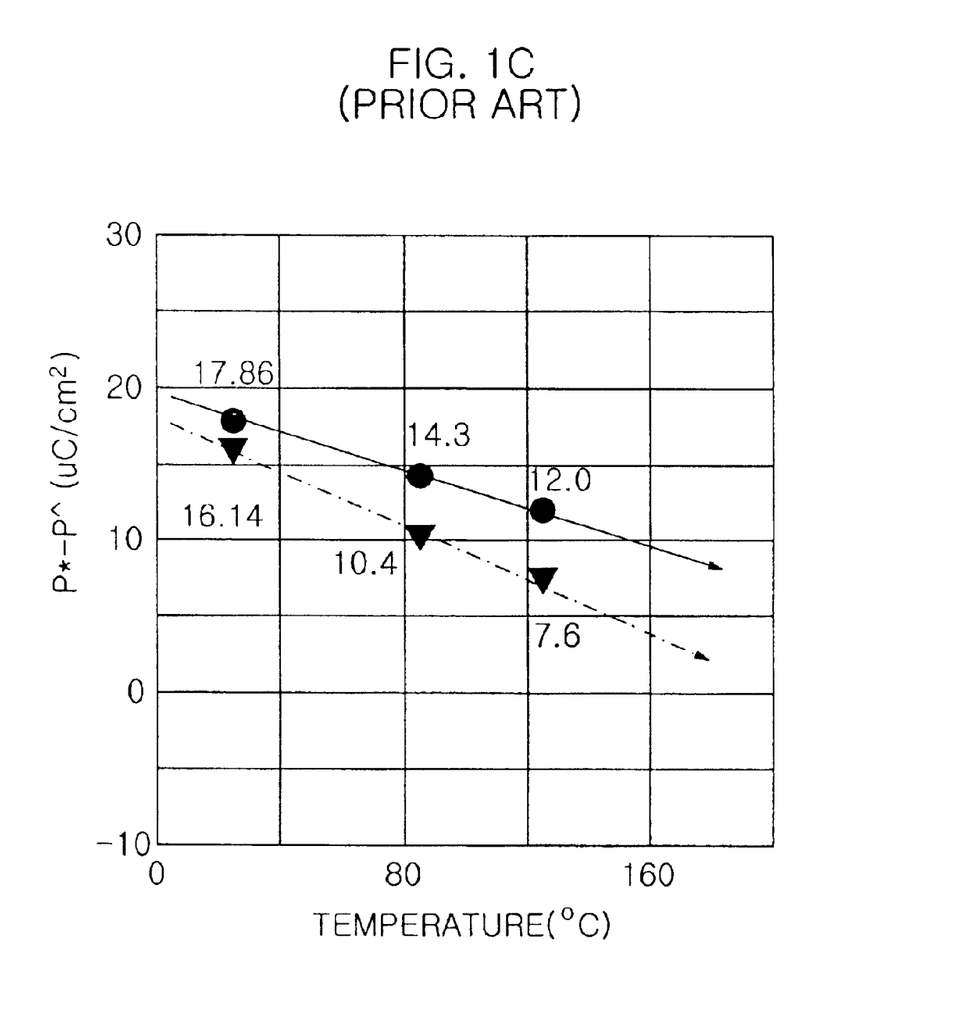
FIG. 1C is a graph showing an attenuation range of the reliability for the conventional BLT layer in a numerical value.

FIG. 1B is a graph showing a result of a reliability test for BLT film fabricated by a conventional method, wherein a horizontal axis represents a switching cycle, a vertical axis denotes a polarization value ($P^*\sim P^\wedge$), and +dP and −dP mean a positive polarization value and a negative polarization value, respectively. FIG. 1C is a graph showing an attenuation range of the reliability in a numerical value, wherein an horizontal axis denotes a test temperature and a vertical axis describes a polarization value ($P^*-P^\wedge$).

Referring to FIG. 1B, a remnant polarization is drastically reduced at about 125° C. (▲, ▼). More precisely, the reliability is drastically reduced at a high switching cycle point when data is rapidly used for a long time. In addition, the reliability is reduced at the high switching cycle point even at a room temperature.

Referring to FIG. 1C, the polarization value is drastically reduced as a measurement temperature gets high. More precisely, the polarization value ($P^*-P^\wedge$) is abruptly reduced from about 18 $\mu C/cm^2$ to less than about 10 $\mu C/cm^2$.

SUMMARY OF THE INVENTION

It is, therefore, an object of the present invention to provide a method for fabricating a ferroelectric memory device capable of suppressing a defect generation caused by a charge impact.

In accordance with an aspect of the present invention, there is provided the ferroelectric memory device, including: a semiconductor substrate on which a transistor is formed; a lower electrode on the interfacial insulation layer, which is connected to a source/drain region of the transistor through a contact penetrating the interfacial insulation layer; an isolating insulation layer on the interfacial insulation layer, which has a planerized surface exposing a surface of the lower electrode and encompasses the lower electrode; a ferroelectric layer covering the isolating insulation layer and lower electrode; an oxygen vacancy compensation layer on the ferroelectric layer compensating an oxygen vacancy caused by a deoxidization of a composition of the ferroelectric layer; and an upper electrode formed on the oxygen vacancy compensation layer.

In addition, there is provided the method for fabricating the ferroelectric memory device, including: forming the interfacial insulation layer on the semiconductor substrate; forming a stack pattern of the lower electrode and a hard mask in order on the interfacial insulation layer; forming the isolating insulation layer on an entire surface having the stack pattern; planerizing the isolating insulation layer until exposing a surface of the hard mask; removing the hard mask by using a liquid chemical; forming the ferroelectric layer on an entire surface having the lower electrode exposed after the hard mask is removed; forming the oxygen vacancy compensation layer on the ferroelectric layer; forming a conductive layer for the upper electrode on the oxygen vacancy compensation layer; and pattering the conductive layer and the oxygen vacancy compensation layer consecutively.

BRIEF DESCRIPTION OF THE DRAWINGS

Other objects and aspects of the invention will become apparent from the following description of the embodiments with reference to the accompanying drawings, in which:

FIG. 2 is a cross-sectional view illustrating a ferroelectric memory device having a capacitor with a merged top plate (MTP) structure in accordance with the present invention.

DETAILED DESCRIPTION OF THE PREFERRED EMBODIMENTS

Hereinafter, an inventive ferroelectric capacitor and a method for fabricating a ferroelectric memory device having the same will be described in detail referring to the accompanying drawings.

FIG. 2 is a cross-sectional view illustrating a ferroelectric memory device containing a merged top plate (MTP) structure in accordance with preferred embodiment of the present invention.

Firstly, a capacitor of the ferroelectric memory device will be explained. As shown, a lower electrode deposited sequentially with an iridium layer 41A, an iridium oxide layer 42A, and a platinum layer 43A is planerized while the lower electrode is encompassed by an isolating insulation layer 46A. A ferroelectric layer 47 is formed on the planerized lower electrode and the isolating insulation layer 46A. Subsequently, an oxygen vacancy compensation layer 48 and an upper electrode are deposited on the ferroelectric layer 47.

Herein, the oxygen vacancy compensation layer 48 using a metal oxide layer such as ruthenium (Ru) or iridium (Ir) oxide serves to compensate a defect, i.e. oxygen vacancy, caused by deoxidization of titanium (Ti) within a $Bi_{4-x}La_xTi_3O_{12}$ (BLT) or $Bi_4Ti_3O_{12}$ (BTO) that is used to form the ferroelectric layer 47. The oxygen vacancy compensation layer 48 has a thickness of about 10 Å to about 1000 Å, wherein the oxygen vacancy compensation layer 48 is deposited at a temperature ranging from about 100° C. to about 700° C. and at a pressure of about 1.0 mtorr to about 10 torr by using a chemical vapor deposition (CVD) or an atomic layer deposition (ALD) technique.

The BLT or BTO is used for forming the ferroelectric layer 47, the ferroelectric layer 47 has a thickness of about 50 Å to about 3000 Å, and one or a few layers selected out of such materials as platinum (Pt), iridium (Ir), ruthenium (Ru), tungsten (W), iridium oxide layer, ruthenium oxide layer, tungsten nitride layer, and titanium nitride layer are used to form the upper electrode 49.

One of such materials as a high density plasma (HDP) oxide layer, Boro-Phospho-Silicate-Glass (BPSG), Boro-Silicate-Glass (BSG), or Phospho-Silicate-Glass (PSG) is used to form the isolating insulation layer 46A.

Next, a transistor containing source/drain regions 35A and 35B, a gate oxide layer 33, and a word line 34 is formed on the semiconductor substrate 31, wherein a device isolation layer 32 is formed in advance on the semiconductor substrate 31 before forming the transistor. An upper surface of the semiconductor substrate 31 is covered with a first interfacial layer 36, and a bit line contact 37 is connected to one of the source/drain region 35A by passing through the first interfacial layer 36. A second interfacial insulation layer 39 is formed on the first interfacial insulation layer 36, and both of the first and second interfacial insulation layers 39 are penetrated throughout the above structure so as to connect a storage node contact 40 to the other source/drain region 35B. Herein, the storage node contact 40 is connected to the iridium layer 41A used for the lower electrode, wherein the storage node contact 40 is formed sequentially with a poly silicon plug, titanium silicide, and titanium nitride.

FIGS. 3A to 3F show cross-sectional views illustrating a method for fabricating the ferroelectric memory device illustrated in FIG. 2.

Figure 3A:
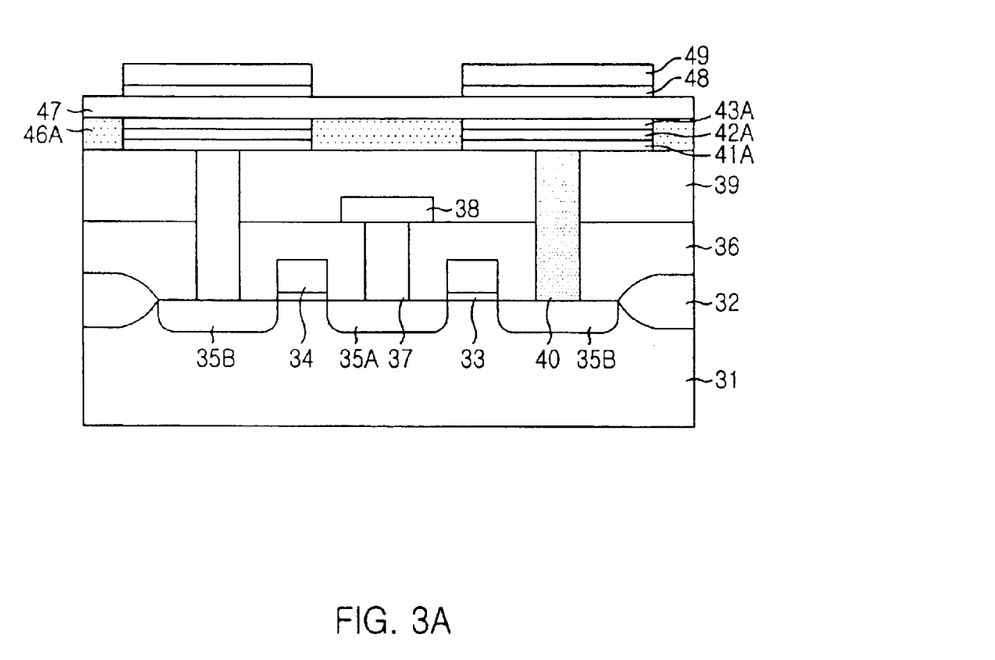
FIGS. 3A to 3F are cross-sectional views illustrating a method for fabricating the ferroelectric device illustrated in FIG. 2.

As illustrated in FIG. 3A, the device isolation layer 32 for separating devices is formed on the semiconductor substrate 31 in order to predetermine an active area. The gate oxide layer 33 and the word line 34 are sequentially formed on the active area of the semiconductor substrate 31.

Next, both sides of the word line 34 on the semiconductor substrate 31 are implanted with an impurity in order to form the source/drain regions 35A and 35B. A spacer may be formed at both lateral sides of the word line 34, although it is not illustrated in the aforementioned drawings. As a result, the source/drain regions 35A and 35B for a light doped drain (LDD) structure can be formed. More precisely, the spacer is formed at the both lateral sides of the word line after forming the LDD area by carrying out a low concentration impurity implantation using a mask, and the source/drain regions 35A and 35B adjacent to the LDD area are formed by performing a high concentration impurity implantation using a mask into the word line 34 and spacer.

A bit line contact hole exposing one source/drain region 35A formed by etching the first interfacial insulation layer 36 through the use of a contact mask (not shown in FIG. 3A) is formed after the first interfacial insulation layer 36 is deposited on the semiconductor substrate providing the transistor and planerized thereafter. In addition, the bit line contact 37 buried in the bit line contact hole is formed, wherein the bit line contact 37 can be a tungsten plug formed by an etch back process or a chemical mechanical polishing (CMP) process after depositing the tungsten.

A conductive layer for the bit line is deposited on an entire surface and patterned so as to form the bit line 38 connected to the bit line contact 37, and the second interfacial insulation layer 39 including a bit line is deposited and planerized.

A storage node contact hole exposing the other source/drain region 35B is formed by etching both of the second interfacial insulation layer 39 and the first interfacial insulation layer 36 with a storage node contact mask not shown is buried in the storage node contact hole thereafter. Furthermore, the storage node contact 40 has a multi layer structure constructed sequentially with a poly silicon plug, a titanium silicide layer, and a titanium nitride layer not shown. Herein, titanium nitride layer is used to form an ohmic contact between the poly silicon plug and the lower electrode, the titanium silicide layer used for a diffusion barrier layer functions to suppress a reciprocal diffusion. Herein, the diffusion barrier layer is subsequently planerized by performing a CMP process.

There is another method for forming the storage node contact 40. A titanium silicide layer is formed after annealing a deposited titanium layer and plugging a tungsten layer. Subsequent to the titanium silicide layer formation, a titanium nitride layer acting as a barrier metal is formed and planerized thereafter by performing a CMP process.

Continuously, a iridium (Ir) layer 41A, an iridium oxide layer ($IrO_2$) 42A, and a platinum (Pt) 43A are deposited in order, wherein the Ir, $IrO_2$, and Pt are used as the conductive layer used as the lower electrode on the second interfacial insulation layer 39 having the storage node contact 40. At this time, those layers mentioned above have a thickness of about 200 Å to about 2000 Å.

As a next step, a titanium nitride layer acting as a hard mask which is used for patterning the lower electrode on the Pt layer 43A is deposited, and a patterned photo-resist layer 45 predetermining the lower electrode on the titanium nitride layer 44 is also formed. At this time, the titanium nitride layer 44 has a thickness of about 50 Å to about 1000 Å and shows a superior slope property when a patterning process is carried out on the lower electrode.

The titanium nitride layer 44 is etched and patterned by using the patterned photo-resist mask.

Figure 3B:
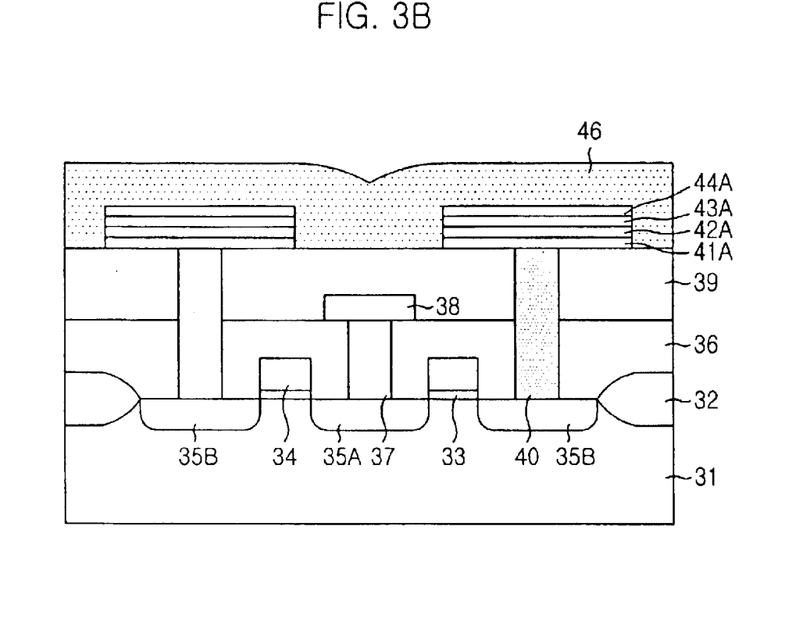

As shown in FIG. 3B, the patterned photo-resist mask 45 is removed, and the pt layer 43A, the iridium oxide layer 42A, and the iridium layer 41A are all patterned in order by using the patterned titanium nitride layer 44. Eventually, the lower electrode having a triple layer stack structure is formed. Herein, the triple layer stack structure is constituted with Ir layer 41A used as an oxygen barrier, the $IrO_2$ layer 42A used as a glue layer, and the Pt layer 43A.

The Pt layer 43A, which is one of the elements of the lower electrode can be substituted for a ruthenium (Ru) layer, an iridium (Ir) layer (Ir), a tungsten (W)layer or a tungsten nitride layer. The iridium ($IrO_2$) oxide layer 42A, which is used for the glue layer, can be substituted for a ruthenium oxide layer, or a tungsten oxide layer. The Ir layer 41A, which is used as the oxygen barrier layer, can be also substituted for a ruthenium (Ru) layer.

Usually, a portion of the titanium nitride layer 44 used for the hard mask is removed, and thus, the rest titanium layer 44 with a decreased thickness becomes a remnant layer on the platinum layer 43A when the lower electrode is patterned. Hereinafter, the remnant titanium layer is denoted as reference numeral, 41A.

Next, a third interfacial insulation layer 46 including the lower electrode is formed on an entire surface area until a space between neighboring lower electrodes is completely filled up. At this time, the third interfacial insulation layer 46 uses one of such materials as a HDP oxide layer, BPSG, BSG, or PSG, and it has a thickness of about 1000 Å to about 10000 Å.

Figure 3C:
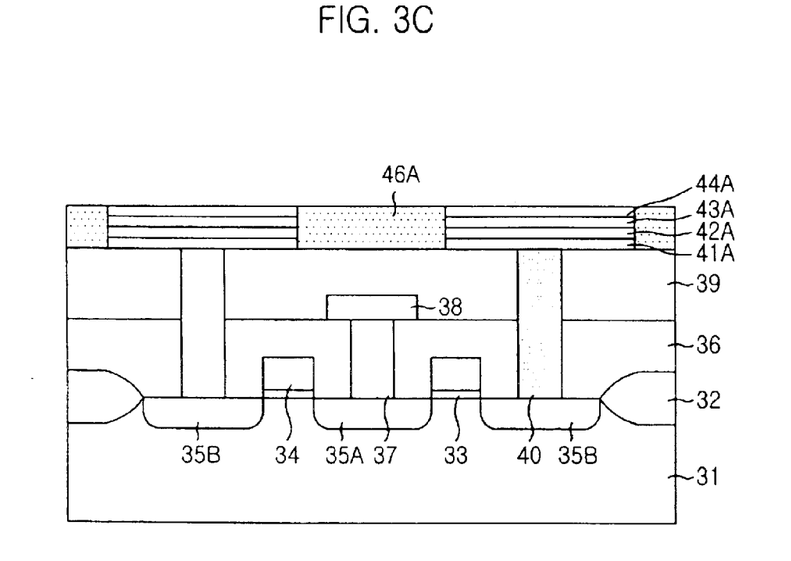

As described in FIG. 3C, an isolating insulation layer 46A encompassing the lower electrode is formed by planerizing the third interfacial insulation layer 46 until a surface of the titanium nitride layer 44A is exposed. At this time, the Pt layer 43A is not damaged even by an excessive CMP process because the titanium nitride 44A is capping the Pt layer 43A.

Figure 3D:
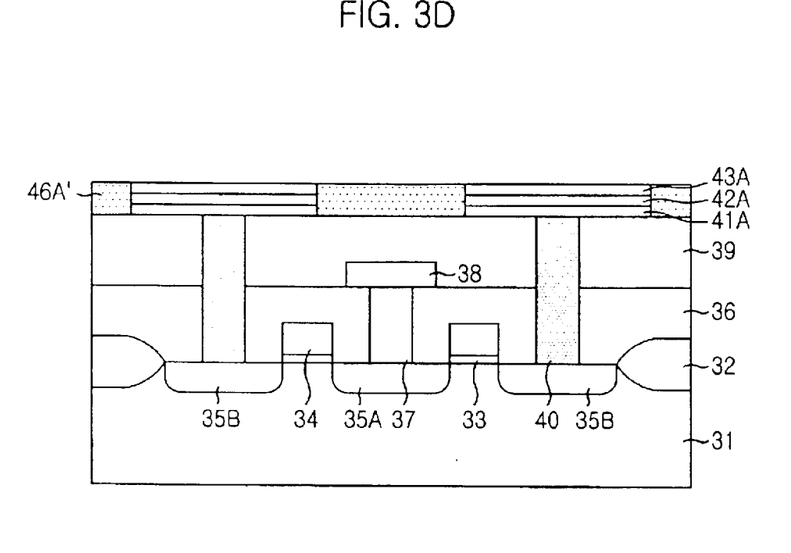

Next, as shown in FIG. 3D, the remnant titanium nitride layer 44A on the platinum layer 43A is removed by soaking it into a SC-1 chemical solution. Herein, the isolating insulation layer 46A is also removed easily by the SC-1 chemical solution because it is also an oxide layer. Eventually, a portion of the isolating insulation layer 46A is removed until the surface of the platinum layer 43A is exposed. For detailed explanation, the SC-1 chemical solution is a solution of HCl, $H_2O_2$, and $H_2O$ and the solution is vigorously reactive with any metal layer. Therefore, the isolating insulation layer 46A is also removed easily.

Consequently, a remnant isolating insulation layer 46A' has a structure which insulates and encompasses the neighboring lower electrodes.

Similarly, the structure such that the isolating insulation layer 46A' encompasses the lower electrode overcomes difficulties in applying a masking process and a planerizing process caused by a step difference existing in the capacitor. In addition, the structure can prevent a short circuit between the lower electrode and the upper electrode.

Figure 3E:
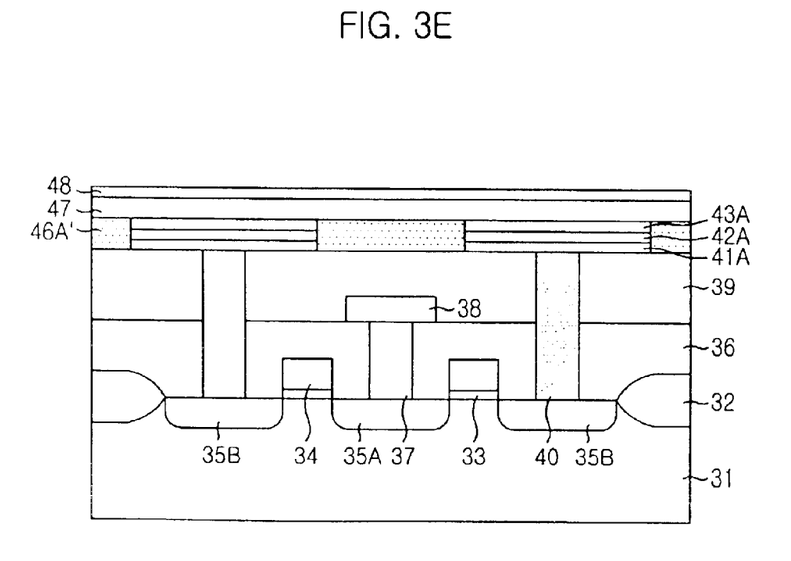

Referring to FIG. 3E, the BLT or BTO ferroelectric layer having a thickness of about 50 Å to about 3000 Å is deposited after finishing a CMP process, and the oxygen vacancy compensation layer 48 is formed on the ferroelectric layer 47.

Herein, the ferroelectric layer 47 goes through a sequence of a nucleation, a nucleus growth, and crystallization. Technically, a rapid thermal anneal (RTP) process is used for the nucleus growth. The RTP process is usually performed at a temperature of about 400° C. to about 800° C., and a ramp-up rate ranges from about 80° C./sec to about 250° C./sec. The crystallization is carried out by a typical furnace annealing process at about 500° C. to about 800° C. using one of such ambient gases as $O_2$, $N_2O$, $N_2$, Ar, Ne, Kr, Xe, and He. The ferroelectric layer 47 having a thickness of about 50 Å to about 3000 Å is formed by a spin coating process or a liquid source mixed chemical deposition (LSMCD) process.

The oxygen vacancy compensation layer 48 compensates a defect, that is, an oxygen vacancy generated by deoxidization of titanium within the BLT or BTO used as the ferroelectric layer 47. A metal oxide layer such as a ruthenium ($RuO_x$) oxide layer or iridium ($IrO_x$) oxide layer is usually used for forming the oxygen vacancy compensation layer 48. A substitution between the oxygen of ruthenium oxide layer or iridium oxide layer and the defect caused by the titanium deoxidization generated by an externally applied charge impact occurs due to the use of the oxygen vacancy compensation layer 48. Consequently, the titanium can obtain a stable structure without any defect. Furthermore, a fatigue phenomenon can be also stabilized.

The oxygen vacancy compensation layer 48 has a thickness of about 10 Å to about 1000 Å and is deposited by a CVD process or an ALD process at a temperature of about 100° C. to about 700° C. at a pressure of about 1.0 mtorr to about 10 torr.

Figure 3F:
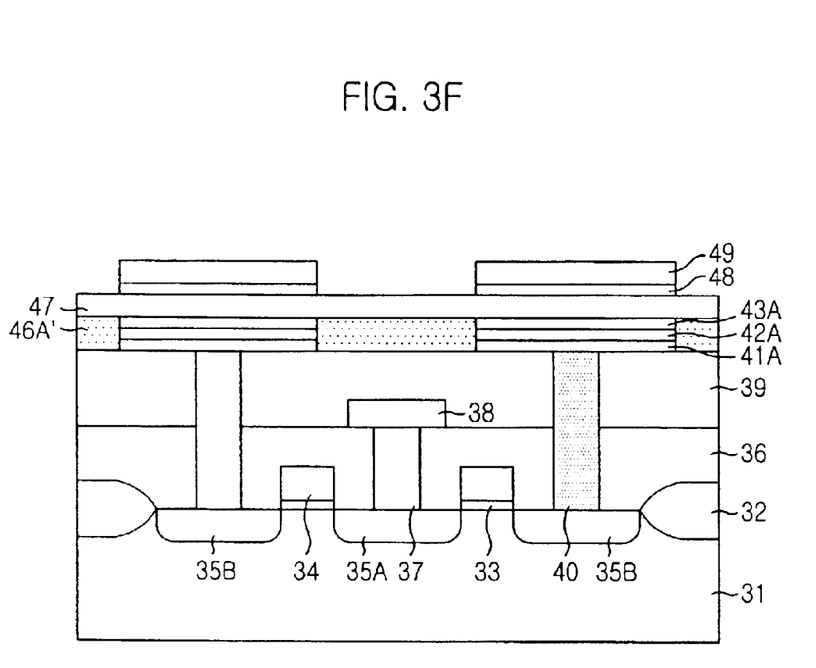

With reference to FIG. 3F, a conductive layer for the upper electrode 49 is formed on the oxygen vacancy compensation layer 48. The conductive layer is photo-resisted and etched so that the upper electrode 49 is formed.

Concurrently, the oxygen vacant compensation layer 48 is etched and remained between the upper electrode 49 and the ferroelectric layer 47.

The conductive layer is formed by using a CVD, physical vapor deposition (PVD), ALD, or plasma enhanced atomic layer deposition (PEALD) process. In addition, the conductive layer consists of one or a few materials selected among platinum (Pt), iridium (Ir), ruthenium (Ru), tungsten (W), an iridium oxide layer, a ruthenium oxide layer, a tungsten nitride layer and a titanium nitride layer.

As mentioned, the capacitor formed in accordance with the present invention is called a MTP capacitor. The lower electrode of the MTP capacitor is encompassed by the isolating insulation layer. The isolating insulation layer 46A prevents a loss of the ferroelectric layer 47 caused by plasma during an etching process. Consequently, an effect of the defect within the ferroelectric layer 47 is abruptly reduced.

In the preferred embodiment of the present invention, the lower electrode having the triple layer stack structure constructed with sequential deposition of the oxygen barrier layer, the glue layer and the metal layer is suggested. It is still possible to form a lower electrode having a single metal layer, wherein the single metal layer is one of such materials as Pt, Ru, Ir, W, and WN.

In addition, $SrBi_2Ta_2O_9$ (SBT) or $SrBi_2(Ta_{1-x}, Nb_x)_2O_9$ (SBTN), which contains tantalum, is also used to form the oxygen vacant compensation layer 48 and shows an identical capability compared with the BLT or BTO in the embodiment of the present invention.

Figure 4A:
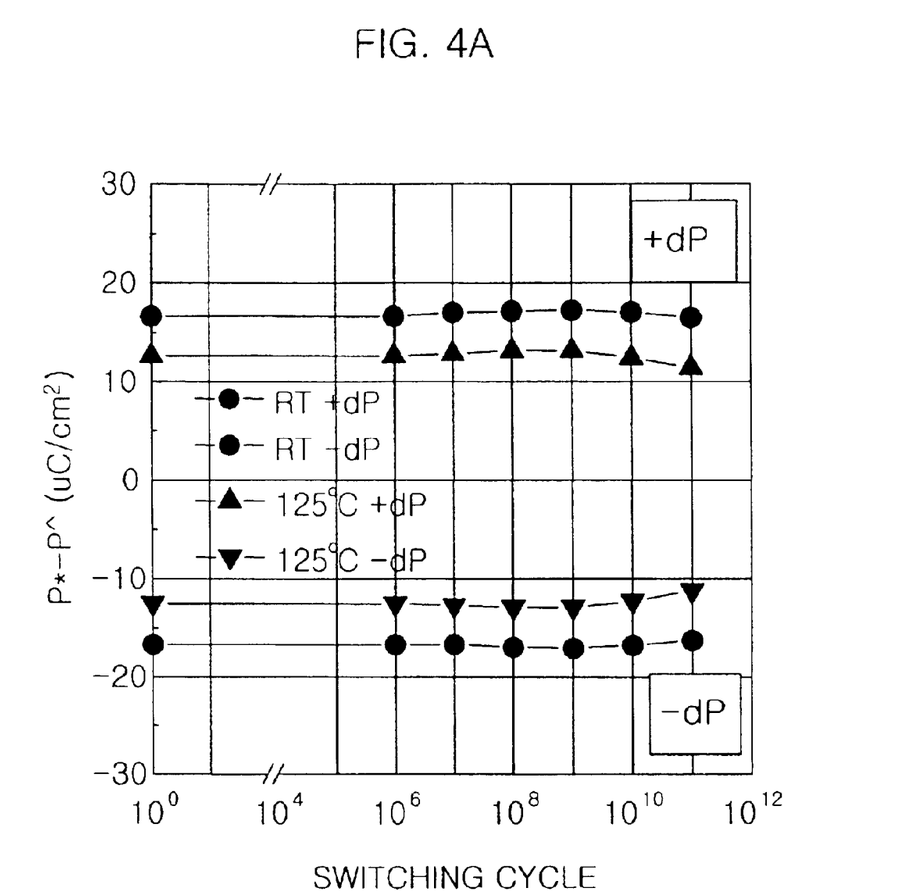
FIG. 4A is a graph showing a reliability measurement result for the BLT layer in accordance with a preferred embodiment of the present invention.
Figure 4B:
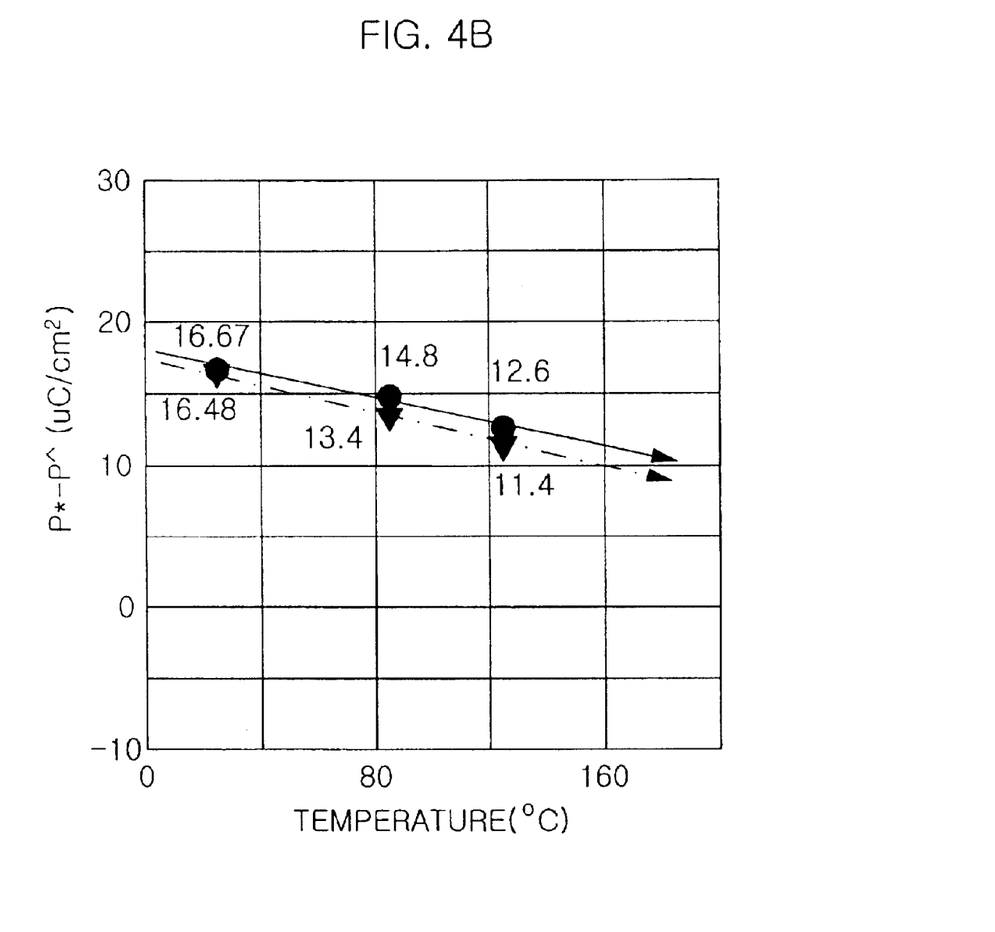
FIG. 4B is a graph showing an attenuation range of the reliability, in a numerical value, for BLT layer in accordance with the preferred embodiment of the present invention.

FIG. 4A is a graph illustrating a result of a reliability measurement for the BLT layer formed in accordance with the present invention. A horizontal axis denotes a switching cycle and a vertical axis represents a polarization value (P*−P^). Reference symbols, +dP and −dP mean a positive polarization value and a negative polarization value, respectively. FIG. 4B shows an attenuation range of the reliability in a numerical value. Herein, a horizontal axis represents a measurement temperature and an vertical axis denotes a polarization value (P*−P^).

As shown, there is no change of a remnant polarization at a room temperature as well as at a temperature of about 125° C. (▲, ▼) although the switching cycle is high. In short, the preferred embodiment of the present invention is reliable even at a high switching cycle when data is rapidly used.

Referring to FIG. 4B, the remnant polarization is slowly reduced as the measurement temperature is increased, and eventually, the remnant polarization value is minimized at about 18 $\mu C/cm^2$ to about 10 $\mu C/cm^2$.

According to the prior art, the remnant polarization value is drastically decreased at about 125° C. (▲, ▼) as the measurement temperature is increased. However, according to the present invention, the remnant polarization value is slowly decreased at the same condition as described above. Accordingly, the present invention shows that the oxygen vacant compensation layer between the BLT layer and the upper electrode improves the reliability of the ferroelectric memory device.

While the present invention has been shown and described with respect to the particular embodiments, it will be apparent to those skilled in the art that many changes and modification may be made without departing from the spirit and scope of the invention as defined in the appended claims.

What is claimed is:

1. A method for fabricating a ferroelectric memory device, comprising the steps of:
   a) forming an interfacial insulation layer on a semiconductor substrate;
   b) forming a stack pattern of a lower electrode and a hard mask on the interfacial insulation layer;
   c) forming an isolating insulation layer on an entire surface having the stack pattern;
   d) planarizing an isolating insulation layer until exposing a surface of the hard mask;
   e) removing the hard mask by using a liquid chemical;
   f) forming a ferroelectric layer on an entire surface having the lower electrode exposed after the hard mask is removed;
   g) forming an oxygen vacancy compensation layer on the ferroelectric layer;
   h) forming a conductive layer for an upper electrode on the oxygen vacancy compensation layer; and
   i) patterning the conductive layer and the oxygen vacancy compensation layer consecutively.

2. The method as recited claim 1, wherein one of materials as $SrBi_2(Ta_{1-x}, Nb_x)_2O_9$ (SBTN), $SrBi_2Ta_2O_9$ (SBT), $Bi_4Ti_3O_{12}$ (BTO), and $Bi_{4-x}La_xTi_3O_{12}$ (BLT) is used in order to form the ferroelectric layer.

3. The method as recited in claim 1, wherein the oxygen vacancy compensation layer is a metal oxide layer deposited at a temperature of about 100° C. to about 700° C. and at a pressure of about 1.0 mtorr to about 10 torr by employing a chemical vapor deposition (CVD) or an atomic layer deposition (ALD) technique.

4. The method as recited in claim 3, wherein the metal oxide layer is a ruthenium oxide layer or iridium layer.

5. The method as recited in claim 1, wherein the oxygen vacancy compensation layer has a thickness ranging about 10 Å to about 1000 Å.

6. The method as recited in claim 1, wherein the isolating insulation layer is planarized until exposing the surface of the hard mask by performing a chemical mechanical polishing (CMP) process.

7. The method as recited in claim 1, wherein one of materials as a HDP oxide layer, BPSG, BSG and PSG is used to form the isolating insulation layer.

* * * * *